May 12, 1964 J. E. PALMER ETAL 3,133,257

OSCILLATOR WITH TRIGGERABLE PHASING

Filed Aug. 22, 1960

INVENTORS
James E. Palmer &
Joe T. Swaim

Joseph D. Black.
Attorney

United States Patent Office 3,133,257
Patented May 12, 1964

3,133,257

OSCILLATOR WITH TRIGGERABLE PHASING

James E. Palmer, Philadelphia, Pa., and Joe T. Swaim, Haddonfield, N.J., assignors to Radio Corporation of America, a corporation of Delaware Filed Aug. 22, 1960, Ser. No. 51,057
6 Claims. (Cl. 331—113)

The invention relates to a continuously operating oscillator having an output which is synchronized with an arbitrarily phased synchronizing signal.

Oscillators are commonly used in various types of equipment such as are found in the fields of communications and data handling to supply signals for performing timing or other functions, or both. It has been found desirable to provide for use in such applications a continuously operating oscillator of constant operating frequency, the output of the oscillator being in synchronism with an arbitrarily phased reference signal. That is, the oscillator is permitted to run free at its own frequency and yet may be forced to assume within a fraction of a cycle a fixed phase relation with a phasing signal. The oscillator frequency should be dependent only on the time determining elements of the oscillator.

It is an object of the invention, therefore, to provide an improved continuously operating oscillator capable of being instantly synchronized with a phasing signal.

A further object is to provide an improved continuously operating oscillator synchronized, with phase shifts from zero to 180°, within a fraction of a cycle with a phasing signal.

A further object is to provide an improved continuously operating oscillator with triggerable phasing and of oscillator frequency independent of power supply voltages, transistor parameters and circuit components other than the time determining elements of the oscillator.

A still further object is to provide a voltage doubling network, instead of an additional power supply voltage, by which energy from a continuously operating oscillator is used to produce the off bias for a phasing switch coupled to the oscillator.

In accomplishing the objects of the invention, a transistor oscillator arranged to be continuously operating at a desired frequency is provided. According to one embodiment, the oscillator comprises a first and a second transistor device having their electrodes interconnected so as to form a continuously operating multivibrator oscillator. An electronic phasing switch including a third transistor device is coupled to the timing circuit of the first transistor. As a feature of the invention, this switch is off-biased by means using energy developed in the oscillator. For example, a voltage doubling network is coupled to the output electrode of one of the oscillator transistors for producing the off bias applied to the phasing switch. An isolation circuit may be coupled between the output electrode of one of the oscillator transistors and an output terminal to insure that the oscillator frequency is not affected by the output load.

In operation, the phasing switch is held open by the off bias from the voltage doubling network. The oscillator proceeds to supply a square wave signal of the desired frequency at the output terminal. Upon a phasing signal being received, the off bias is overridden and a phasing pulse is applied to the timing circuit of the oscillator transistor to which the phasing switch is coupled. This oscillator transistor is immediately turned off, regardless of its condition, and the oscillator assumes the portion of its period which normally occurs immediately after this transistor has been turned off. Thereafter, the oscillator, having been rephased, continues to supply the square wave signal in synchronism with the phasing signal. The oscillator is at all times permitted to run free at its own frequency, the above operation causing the output of the oscillator to assume a fixed phase relation with the phasing signal.

A more detailed description of the invention will now be given in connection with the accompanying drawing, wherein.

Figure 1:
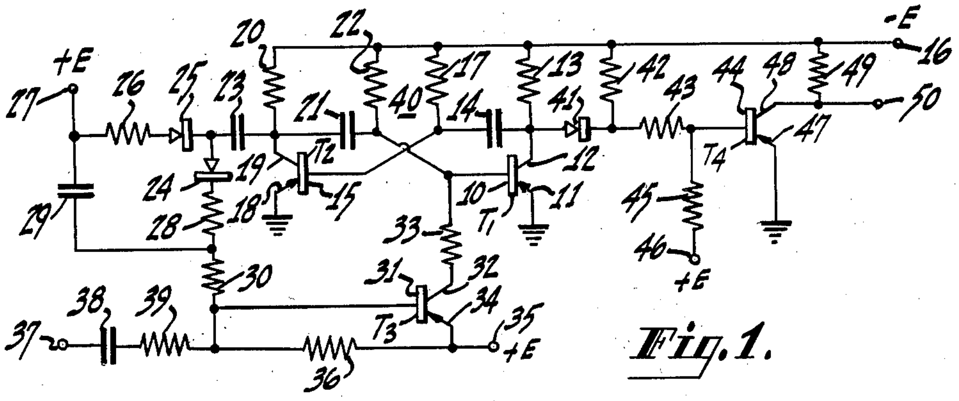
FIG. 1 is a circuit diagram of one embodiment of the invention.

As shown in FIG. 1, a first P-N-P junction transistor $T_1$ is provided having a base electrode 10, an emitter electrode 11, and a collector electrode 12. The emitter electrode 11 is connected to a point of reference potential shown as ground. The collector electrode 12 is connected through a resistor 13 to the negaitve terminal 16 of a source of unidirectional potential, —E. A capacitor 14 is coupled between the collector electrode 12 and the base electrode 15 of a second P-N-P junction transistor $T_2$. A resistor 17 is connected between the terminal 16 and the junction of capacitor 14 and the base electrode 15. The second transistor $T_2$ includes an emitter electrode 18 connected to a point of reference potential shown as ground and a collector electrode 19. The collector electrode 19 is connected through a resistor 20 to the terminal 16 and through a capacitor 21 to the base electrode 10. A resistor 22 is connected between the terminal 16 and the junction of capacitor 21 and base electrode 10. A free-running multivibrator oscillator, indicated generally by the reference numeral 40, is provided whose period is, approximately, $$T=\frac{\sqrt{2}}{2}(R_{22}C_{21}+R_{17}C_{14})$$

The collector electrode 19 is connected through a capacitor 23 to the anode of a crystal doide 24 and to the cathode of a crystal diode 25. The direction of the arrow of the diode symbol indicates the direction of current flow through the respective diodes. The anode of diode 25 is connected through a resistor 26 to the positive terminal 27 of a source of unidirectional potential, +E. The cathode of diode 24 is connected through a resistor 28 and capacitor 29 in series to the terminal 27. The junction of the resistor 28 and capacitor 29 is connected through a resistor 30 to the base electrode 31 of a third P-N-P junction transistor $T_3$. The third transistor $T_3$ also includes a collector electrode 32 connected through a resistor 33 to the base electrode 10 and an emitter electrode 34 connected to the positive terminal 35 of a source of unidirectional potential, +E. A resistor 36 is connected between the base electrode 31 and emitter electrode 34. An input terminal 37 to which a phasing signal can be applied is connected to the base electrode 31 through a capacitor 38 and resistor 39. The third transistor $T_3$ and its associated components, capacitor 38 and resistors 39, 30, 36 and 33, form a phasing switch. Capacitors 23, 29, diodes 24, 25 and resistors 26, 28 form a voltage doubling network.

In providing an isolation circuit between the output of oscillator 40 and the following stages, the collector electrode 12 is connected to the anode of a crystal diode 41. The cathode of diode 41 is connected through a resistor 42 to terminal 16 and through resistor 43 to the base electrode 44 of a fourth P-N-P junction transistor $T_4$. A resistor 45 is connected from the base electrode 44 to a positive terminal 46 of a source of unidirectional, +E. The emitter electrode 47 of the fourth transistor $T_4$ is connected to a point of reference potential shown as ground. The collector electrode 48 may be connected through a resistor 49 to the terminal 16 with the output being derived from the collector electrode 48 via terminal 50.

In describing the operation of the invention, it will be assumed that no phasing signal is present at terminal 37. The oscillator 40 including transistors $T_1$ and $T_2$ operates continuously to supply a square wave signal having a frequency determined according to the above equation. If the output is symmetrical or, in other words, of equal half periods, capacitors 14 and 21 are of equal value and resistors 17 and 22 are of equal value. The operation of the oscillator is controlled largely by the resistance-capacitance decay in the base circuit of each transistor $T_1$ and $T_2$.

Figure 2:
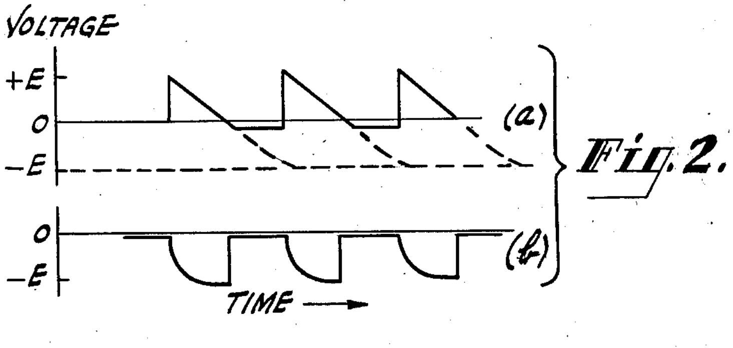
FIGS. 2 and 3 are curves useful in describing the operation of the embodiment given in FIG. 1.

FIG. 2, line *a*, shows the voltage waveform appearing at the base electrode of either transistor $T_1$ or $T_2$, while FIG. 2, line *b*, shows the voltage waveform appearing at the collector electrode of the corresponding transistor. When the first transistor $T_1$ is conducting, the second transistor $T_2$ is non-conducting, and vice versa. Assuming that the base electrode 15 of the second transistor $T_2$ is more positive than zero volts and is decaying exponentially towards $-E$ volts, transistor $T_2$ is non-conducting. When the second transistor base electrode 15 goes slightly negative, the second transistor $T_2$ conducts and is held in this condition by the base current through resistor 17. The second transistor collector electrode 19 swings from $-E$ volts to zero volts.

Immediately before the second transistor $T_2$ becomes conducting, the base electrode 10 of the first transistor $T_1$ is at approximately zero volts and capacitor 21 has E volts across it. The voltage across a capacitor cannot change instantaneously. Therefore, when transistor $T_2$ becomes conducting, the voltage swing from $-E$ to zero volts at the second transistor collector electrode 19 is supplied through capacitor 21. A swing of zero to $+E$ volts occurs at the base electrode 10. The first transistor $T_1$ becomes non-conducting. Since the first transistor collector electrode 12 voltage decays to $-E$ volts before the exponential decay at the base electrode 10 reaches zero volts, assuming that $$3R_{13}C_{14} < \frac{\sqrt{2}}{2} R_{17}C_{14} \text{ and } 3R_{20}C_{21} < \frac{\sqrt{2}}{2} R_{22}C_{21}$$

the capacitor 14 is quickly charged to E volts or the same voltage to which capacitor 21 was previously charged. When the exponential decay at the base electrode 10 of the first transistor $T_1$ reaches zero volts, transistor $T_1$ becomes conducting. The same operation as above follows causing transistor $T_2$ to become non-conducting. The oscillator will continue to oscillate in this manner.

During the periods in which the first transistor $T_1$ is conducting and the first transistor collector electrode 12 voltage is at the reference potential, the diode 41 is forward biased. Diode 41 conducts, causing transistor $T_1$ to supply current through resistor 13 and through resistor 42 via diode 41. Resistors 42, 43 and 45 form a voltage dividing network. Upon transistor $T_1$ supplying current through resistor 42, the point on the voltage dividing network to which base electrode 44 is connected becomes slightly positive with respect to the reference potential. The fourth transistor $T_4$ is held non-conducting, and a negative collector electrode 48 voltage is applied to output terminal 50. During the periods in which the first transistor $T_1$ is non-conducting, the negative collector electrode 12 voltage back biases diode 41. Diode 41 is non-conducting. A negative voltage is now applied to the base electrode 44 from the junction of resistors 43 and 45. The fourth transistor $T_4$ conducts, and the reference potential is applied to terminal 50 by electrode 48. The portion of the circuit including transistor $T_4$ serves to isolate the oscillator 40 from the output load. When the first transistor $T_1$ becomes non-conducting, capacitor 14 can only charge through resistor 13 because of the operation of the isolation circuit. The timing of the oscillator is therefore not effected by the output load connected to the collector electrode 48. A square wave signal having a frequency determined by the oscillator timing appears at the output terminal 50.

The operation of the voltage doubler and the phasing switch will now be described. Upon transistor $T_2$ becoming conducting, the positive going edge of the collector electrode 19 voltage is applied to capacitor 23. This action back biases diode 25 and forward biases diode 24. Capacitor 29 charges through resistor 28 and diode 24. When the second transistor $T_2$ becomes non-conducting, the negative going edge of its collector electrode 19 voltage applied to capacitor 23 causes diode 25 to be forward biased and diode 24 to be back biased. As a result, the junction of diodes 24 and 25 is prevented from going as negative as the voltage swing applied to capacitor 23, since capacitor 23 can charge through resistor 26 and diode 25. Capacitor 29 can discharge only over the path including resistor 30. Resistor 30 is made much larger than resistor 28, causing the discharge time of capacitor 29 to be much longer than the charging time. As a result, the instantaneous voltage appearing at the junction of capacitor 29 and resistor 28, which is applied to the base electrode 31 of the third transistor $T_3$ via the voltage dividing network including resistors 30 and 36, is more positive than $+E$. An off bias is therefore supplied by the doubler circuit just described to maintain the base electrode 31 positive with respect to the emitter electrode 34 and to hold the third transistor $T_3$ non-conducting and the phasing switch opened. By using the energy from the oscillator 40 to produce the off bias for the transistor $T_3$, it is possible to operate the phasing switch including transistor $T_3$ without an additional positive power supply voltage.

Figure 3:
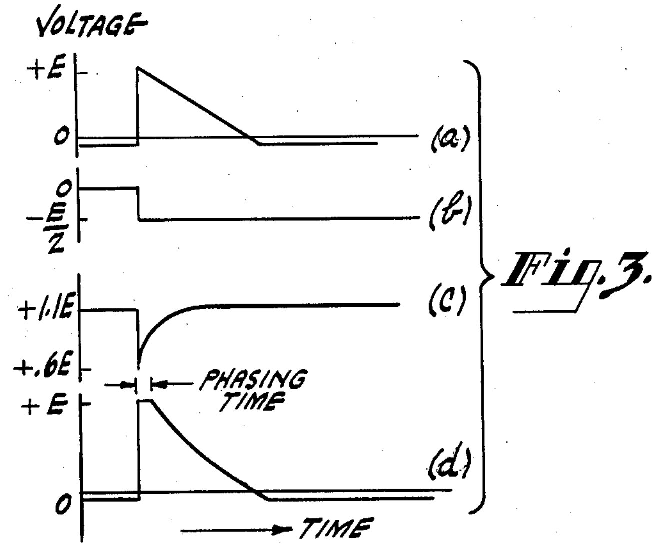

In the absence of a phasing signal, a positive going voltage more positive than $+E$, say $+1.1E$, is applied to the base electrode 31 of the third transistor $T_3$. The third transistor $T_3$ is held non-conducting. Assume that a negative voltage swing from zero volts to $$-\frac{E}{2}$$

as shown in curve *b* of FIG. 3, occurs at terminal 37 at some arbitrary time. This change in voltage is coupled via capacitor 38 to the base electrode 31. A voltage swing from $+1.1E$ to say $+.6E$, as shown in curve *c* of FIG. 3, occurs at the junction of resistor 39 and capacitor 38 or base resistor of transistor $T_3$. Transistor $T_3$ becomes conducting, and the collector electrode 32 voltage is as shown in curve *d* of FIG. 3. Resistor 33 is made much smaller in value than resistor 22. As a result, the time constant of resistor 33-capacitor 21 is much smaller than that of resistor 22-capacitor 21. Capacitor 21 is charged to $+E$, where the power supply voltage $|+E|$ is equal to the power supply voltage $|-E|$, in a period of time much shorter than the half period of the oscillator 40. A positive going voltage $+E$ appears at the base electrode 10 of transistor $T_1$, as shown in curve *a* of FIG. 3. Transistor $T_1$ is immediately made non-conducting regardless of its state at the time of the phase signal. The oscillator 40 continues operation from the portion of its period immediately after transistor $T_1$ has become non-conducting.

The on period of the switching transistor $T_3$ is determined for the most part by capacitor 38 and resistor 39. If the time constant of capacitor 38 and resistor 39 is approximately equal to that of resistor 33 and capacitor 21, the transistor will be conducting only long enough to charge capacitor 21 to $+E$ volts. Since this period shown in curve *d* of FIG. 3 is very short compared to the half period of the oscillator 40, almost instant phasing occurs. If the first transistor $T_1$ is conducting at the time of the phasing signal, it immediately becomes non-conducting, and the oscillator continues operation from the moment in its period when the first transistor $T_1$ ceases conduction. If the first transistor $T_1$ is non-conducting at the time of the phasing signal, it remains non-conducting, and the oscillator 40 continues operation from the moment in its period when the first transistor $T_1$ ceases conduction. Assuming that the first transistor $T_1$ is about to conduct in the normal operation of the oscillator 40 at the time of the phasing signal, a phase shift approaching 180° takes place. The degree of phase shift is less in amount, going forward or backward in the cycle according to the moment in the period of the oscillator 40 other than above at which the phasing signal occurs. In any case, the output signal appearing at terminal 50 is in synchronism with the phasing signal. As each phasing signal is applied to terminal 37, the oscillator 40 is instantaneously phased to a predetermined phase relationship with that phasing signal. By the above operation, a continuously operating oscillator is provided having an output in synchronism with an arbitrarily phased reference or synchronizing signal.

While it has been indicated that the positive power supply voltage +E at terminal 35 is equal in absolute value to the negative power supply voltage −E at terminal 16, it is possible by using a value of +E different than that of −E to provide different synchronizing positions for the output of the oscillator 40. That is, the time relation of the output signal at terminal 50 with respect to the phasing signal can be varied.

With the half period of the oscillator 40 much greater than the turn on time of a transistor, the timing of the oscillator 40 is virtually independent of variations in transistor parameters. As the transistor parameters vary, the exponential decay circuits which control operation of the oscillator 40 are substantially unaffected and the oscillator timing remains constant. The timing of the oscillator 40 is also independent of changes in power supply. Assume that −E equals −8 volts and changes to −10 volts. The voltage swing coupled across either capacitor 14 or 21 when either transistor $T_1$ or $T_2$ becomes conducting is increased from 8 to 10 volts. Also the exponential decay is towards a voltage which changes from −8 to −10 volts. However, the voltage decay only reaches the halfway point or approximately zero volts before the change in state of the transistor occurs. This halfway point remains unchanged. As a result, the oscillator timing is virtually independent of changes in power supply voltage.

The arrangement of the invention is particularly suitable for use in applications where the output of the oscillator is gated by the same signal as is applied to the terminal 37. When the output gate is open, the signal passed by the gate will have a fixed phase relationship with the leading edge of the gating signal.

In an embodiment of the invention which has been constructed, the oscillator 40 was made to have a period of 22 milliseconds or 45.5 cycles per second with equal half periods. The +E voltage at terminals 27, 35 and 46 was +13 v., while the −E voltage at terminal 16 was −13 v. +18 v. was produced at the junction of capacitor 29 and resistor 28. The following component values, given only by way of example, were used.

| | | |
|---|---|---|
| Capacitors 14, 21 | microfarad | 2 |
| Capacitor 38 | do | .33 |
| Capacitor 23 | do | 2 |
| Capacitor 29 | do | 4 |
| Resistor 13 | ohms | 680 |
| Resistors 17, 22 | do | 7,800 |
| Resistor 20 | do | 620 |
| Resistor 33 | do | 80 |
| Resistor 30 | do | 15,000 |
| Resistor 36 | do | 4,000 |
| Resistor 39 | do | 680 |
| Resistors 26, 28 | do | 3,300 |
| Resistors 42, 43, 49 | do | 3,300 |
| Resistor 45 | do | 18,000 |
| Transistors $T_1$, $T_2$, $T_3$, $T_4$ | | 2N581 |

What is claimed is:

1. In combination, first and second transistor devices each including a base electrode, emitter electrode and collector electrode, a first timing circuit connected between the collector electrode of said first transistor device and the base electrode of said second transistor device, a second timing circuit connected between the collector electrode of said second transistor device and the base electrode of said first transistor device, means to connect the collector electrodes of said first and said second transistor device to a source of unidirectional potential and to connect the emitter electrodes of said first and said second transistor device to a point of reference potential, whereby the electrodes of said first and second transistor devices are interconnected to form a free-running multivibrator oscillator, means to derive an output signal from the collector electrode of said second transistor device, a phasing switch coupled to the junction of said first timing circuit and the base electrode of said second transistor device, means to apply a phasing signal of any phase with respect to said output signal to said switch, said switch being responsive to said phasing signal to apply a pulse to said first timing circuit and thereby force said multivibrator to assume at the time of said phasing signal the portion of its period in which said second transistor is just made non-conducting, said oscillator thereafter continuing its operation from said portion of its period with said output signal synchronized with said phasing signal, and means coupled between the collector electrode of said first transistor device and said switch responsive to the energy from said oscillator for maintaining said switch inoperative in the absence of said phasing signal.

2. An oscillator with triggerable phasing comprising, in combination, first and second transistor devices having input and output electrodes, means for interconnecting said electrodes to form a free-running multivibrator oscillator including said first and second transistor devices, a third transistor device having a base electrode, collector electrode and emitter electrode, means to derive an output signal from said second transistor device, means to couple said collector electrode to the input electrode of said second transistor device, means to connect said emitter electrode to a source of unidirectional potential, means to apply a phasing signal of any phase with respect to said output signal to said base electrode, said third transistor device being responsive to said phasing signal to apply a pulse to said second transistor device and thereby force said multivibrator to assume at the time of said phasing signal the portion of its period in which said second transistor device is just made non-conducting, said oscillator thereafter continuing its operation from said portion of its period with said output signal synchronized with said phasing signal, a capacitor, means to couple one side of said capacitor to the output electrode of said first transistor device, a first unidirectional current conducting device having a cathode and an anode, a second unidirectional current conducting device having a cathode and an anode, means to connect the anode of said first unidirectional current conducting device and the cathode of said second unidirectional current conducting device to the other side of said capacitor, a second capacitor larger than said first capacitor, a first resistor, a second resistor, means to connect one side of said second capacitor to the cathode of said first unidirectional current conducting device through said first resistor, means to connect the other side of said second capacitor to said source of unidirectional potential and through said second resistor to the anode of said second unidirectional current conducting device, whereby said second capacitor is charged as a result of the energy applied to said first capacitor from the output electrode of said first transistor device to an instantaneous voltage level greater than that of said unidirectional potential, and means to apply the voltage appearing at the junction of said second capacitor and said first resistor to said base electrode so as to bias off said third transistor device in the absence of said phasing signal.

3. In combination, a free-running oscillator, a phasing switch coupled to said oscillator, means to derive an output signal from said oscillator, means to apply a phasing signal of any phase with respect to said output signal to said phasing switch, said phasing switch being responsive to said phasing signal to operate said oscillator to produce said output signal in synchronism with said phasing signal, a capacitor having one side coupled to said oscillator and responsive to energy from said oscillator, a first diode having an anode and cathode, a second diode having an anode and a cathode, a second capacitor larger than said first capacitor, a first resistor, a second resistor, means to connect one side of said second capacitor through said first resistor to the cathode of said second diode, means to connect the other side of said second capacitor to a source of positive unidirectional potential and through said second resistor to the anode of said first diode, means to connect the cathode of said first diode and the anode of said second diode to the other side of said first capacitor, whereby said second capacitor is held charged at an instantaneous voltage level greater than said unidirectional potential as a result of the energy applied to said first capacitor from said oscillator, and means to apply the voltage appearing at the junction of said second capacitor and said first resistor to said switch to hold said switch inoperative in the absence of said phasing signal.

4. In combination, first and second transistor devices each including a base electrode, emitter electrode and collector electrode, a first resistance-capacitance timing circuit connected between the collector electrode of said first transistor device and the base electrode of said second transistor device, a second resistance-capacitance timing circuit connected between the collector electrode of said second transistor device and the base electrode of said first transistor device, means to connect the collector electrodes of said first and said second transistor device to a source of unidirectional potential and to connect the emitter electrodes of said first and said second transistor device to a point of reference potential, whereby the electrodes of said first and second transistor devices are interconnected to form a free-running multivibrator oscillator, an output circuit, means including a diode device coupled between said output circuit and the collector electrode of said second transistor device for applying an output signal from said oscillator to said output circuit, said diode device being arranged to isolate the charging path for said second timing circuit from said output circuit and thereby cause the oscillator timing to be unaffected by said output circuit, a phasing switch coupled to the junction of said first timing circuit and the base electrode of said second transistor device, means to apply a phasing signal of any desired phase with respect to said output signal to said switch, said switch being responsive to said phasing signal to apply a pulse to said first timing circuit and thereby force said multivibrator to assume at the time of said phasing signal the portion of its period in which said second transistor is just made non-conducting, said oscillator thereafter continuing its operation from said portion of its period with said output signal synchronized with said phasing signal, and means coupled between the collector electrode of said first transistor device and said switch responsive to the energy from said oscillator for maintaining said switch inoperative in the absence of said phasing signal.

5. An oscillator with triggerable phasing comprising, in combination, first and second transistor devices having input and output electrodes interconnected to form a free-running multivibrator oscillator, a third transistor device having a base electrode, collector electrode and emitter electrode, an output circuit, means including a diode device coupled between the output electrode of said second transistor device and said output circuit for applying an output signal from said oscillator to said output circuit and at the same time maintain said oscillator timing unaffected by said output circuit, means to couple said collector electrode to the input electrode of said second transistor device, means to connect said emitter electrode to a source of unidirectional potential, means to apply a phasing signal of any phase with respect to said output signal to said base electrode, said third transistor device being responsive to said phasing signal to apply a pulse to said second transistor device and thereby force said multivibrator to assume at the time of said phasing signal the portion of its period in which said second transistor device is just made non-conducting, said oscillator thereafter continuing its operation from said portion of its period with said output signal synchronized with said phasing signal, a capacitor, means to couple one side of said capacitor to the output electrode of said first transistor device, a first unidirectional current conducting device having a cathode and an anode, a second unidirectional current conducting device having a cathode and an anode, means to connect the anode of said first unidirectional current conducting device and the cathode of said second unidirectional current conducting device to the other side of said capacitor, a second capacitor larger than said first capacitor, a first resistor, a second resistor, means to connect one side of said second capacitor to the cathode of said first unidirectional current conducting device through said first resistor, means to connect the other side of said second capacitor to said source of unidirectional potential and through said second resistor to the anode of said second unidirectional current conducting device, said second capacitor being connected so that it is charged as a result of the energy applied to said first capacitor from the output electrode of said first transistor device to an instantaneous voltage level greater than that of said unidirectional potential, and means to apply the voltage appearing at the junction of said second capacitor and said first resistor to said base electrode to bias off said third transistor device in the absence of said phasing signal.

6. An oscillator with triggerable phasing comprising, in combination, a free-running multivibrator oscillator including a circuit for determining the phase and frequency of said oscillator, means to derive an output signal from said oscillator, a transistor device having base, emitter and collector electrodes, means to connect said emitter electrode to a source of unidirectional potential and to connect said collector electrode to said circuit, means coupled to said oscillator and to said base electrode responsive to energy from said oscillator to apply a bias voltage to said base electrode which is of a level and polarity to hold said transistor device non-conducting, means to apply a phasing signal of any phase with respect to said output signal to said base electrode with said phasing signal having a polarity and level to override said bias voltage to cause said transistor device to conduct and thereby apply said phasing signal from said collector electrode to said circuit, said circuit being responsive to said phasing signal to cause said output signal to be synchronized with said phasing signal.

References Cited in the file of this patent

UNITED STATES PATENTS

| | | |
|---|---|---|
| 2,443,922 | Moore | June 22, 1948 |
| 2,823,311 | Bastir | Feb. 11, 1958 |
| 2,824,229 | Gratian | Feb. 18, 1958 |
| 2,848,610 | Freienmuth | Aug. 19, 1958 |
| 3,046,490 | Marshall | July 24, 1962 |

OTHER REFERENCES

IBM Tech. Disclosure Bulletin vol. 2, No. 4, page 90, December 1959.